(12) United States Patent
Szczpinski et al.

(10) Patent No.: US 7,135,723 B2
(45) Date of Patent: Nov. 14, 2006

(54) INTEGRATED CIRCUIT WITH A TEST CIRCUIT

(75) Inventors: Kazimierz Szczpinski, Münich (DE); Johann Pfeiffer, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 95 days.

(21) Appl. No.: 10/810,489

(22) Filed: Mar. 26, 2004

(65) Prior Publication Data

US 2004/0217349 A1    Nov. 4, 2004

(30) Foreign Application Priority Data

Apr. 1, 2003    (DE)    ................. 103 14 616

(51) Int. Cl.
*H01L 29/76*    (2006.01)
(52) U.S. Cl. ..................................... 257/213
(58) Field of Classification Search ................. 257/213
See application file for complete search history.

(56) References Cited

U.S. PATENT DOCUMENTS

| | | | |
|---|---|---|---|
| 5,332,973 A | 7/1994 | Brown et al. | |
| 6,518,900 B1 * | 2/2003 | Oehler et al. | ................ 341/120 |
| 6,907,555 B1 * | 6/2005 | Nomura et al. | ............. 714/719 |

* cited by examiner

*Primary Examiner*—Long Pham
(74) *Attorney, Agent, or Firm*—Patterson & Sheridan, L.L.P.

(57) ABSTRACT

An integrated circuit with a test circuit having a measurement converter circuit and an activation unit. The measurement converter circuit converts one or more circuit-internal signals into a measured value. The activation unit activates the measurement converter circuit in accordance with an activation signal. The measurement converter circuit and the activation unit are connected to a connection pad. The activation unit is configured in such a way as to switch on the measurement converter circuit by means of the activation signal received via the connection pad. The measured value can be tapped off via the connection pad.

16 Claims, 3 Drawing Sheets

INTEGRATED CIRCUIT WITH A TEST CIRCUIT

CROSS-REFERENCE TO RELATED APPLICATIONS

This application claims foreign priority benefits under 35 U.S.C. §119 to co-pending German patent application number 103 14 616.4, filed Apr. 1, 2003. This related patent application is herein incorporated by reference in its entirety.

BACKGROUND OF THE INVENTION

1. Field of the Invention

The invention relates to an integrated circuit with a test circuit for checking circuit-internal signals with the aid of an external tester device. The invention furthermore relates to a method for checking a function in an integrated circuit. The invention furthermore relates to a test system with an integrated circuit and a tester device for checking a function in the integrated circuit.

2. Description of the Related Art

During the testing of integrated circuits, it is necessary to detect internal signals and forward them to a tester device for checking. The internal signals can be tapped off on the one hand via connection pads of the integrated circuit or by placing measuring tips on connecting lines of the integrated circuit. The number of available connection pads is limited on an integrated circuit since said connection pads take up a large area in comparison with the circuit structures. On the other hand, signals detected by measuring tips are measurable only with a large error tolerance being accepted, since the driver power of the signals between the gate circuits of the integrated circuit usually does not suffice to sufficiently compensate for the inductive load of a measuring tip or of the contact between measuring tip and interconnect. Equally, in the case of analog signals, the resistance of the measuring tip, of the tester line with respect to the measuring tip and/or of the contact between measuring tip and interconnect is beset with an unknown resistance which corrupts the measurement of currents or voltages.

In the case of very weak signals, in particular, the measurement with an external tester device leads to unusable results, irrespective of whether the measured signal is measured via a connection pad or by emplacement of a measuring tip.

Hitherto, test mode circuits have been provided in the integrated circuit, which check the internal signals or internal signal relationships and compare them with corresponding desired values in order to check the circuit in accordance with its specification. One disadvantage of the test mode circuits is the large space requirement in the integrated circuit, since each test mode circuit has to be connected to a control circuit with an interconnect.

A further disadvantage of measuring internal signals by means of an externally connected tester device is that the signal changes in some instances take place so rapidly that the external tester device cannot ascertain them on account of capacitances and inductances.

SUMMARY OF THE INVENTION

Therefore, it is an object of the present invention to provide an integrated circuit in such a way that internal signals can be checked in a simple and accurate manner and with a smallest possible number of connection pads used. Furthermore, it is an object of the present invention to provide a method for checking a function in an integrated circuit, it being possible to check internal signals in a simple manner with the aid of a tester device.

A first aspect of the present invention provides an integrated circuit with a test circuit. The test circuit has a measurement converter circuit for converting one or more circuit-internal signals into a measured value and an activation unit for activating the measurement converter circuit in accordance with an activation signal. The measurement converter circuit and the activation unit are connected to a connection pad. The activation unit is configured in such a way as to permanently switch on the measurement converter circuit by means of the activation signal received via the connection pad, it being possible after switch-on to tap off the measured value via the connection pad.

The integrated circuit according to the invention thus makes it possible to use an arbitrary connection pad of the integrated circuit for checking internal signals. The internal signals are conditioned with the aid of a measurement converter circuit in such a way that they can be measured in a simple manner with the aid of a tester device. In this case, the signals are conditioned or converted or amplified in such a way that possible contact-making or conduction resistances between the measuring circuit and the tester device have as little influence as possible on the measurement of the measured value generated by the measurement converter circuit. Since the measurement converter circuit is essentially switched off in the unactivated state, the current requirement is not increased by the measurement converter circuits during normal operation of the integrated circuit. The use of the measurement converter circuit makes it possible to convert weak signals which are driven internally within the circuit only with a weak driver power in such a way that they can be measured externally in a simple manner and with the least possible error. Moreover, such a measurement converter circuit can convert rapid signal changes into a measured value in such a way that the measured value makes it possible to check the signal on the basis of a desired value of the measured value.

The invention has the advantage that the additional measurement converter circuit does not significantly influence the signals examined, or does not influence them at all, so that the checked function and the circuit-internal timing are not altered as a result. Since the measurement converter circuit or the activation unit is preferably arranged locally in the vicinity of the circuit of the checking function, the complexity of the overall circuit is not significantly increased, as is the case for example when providing test mode circuits which are driven by a common control logic.

It may preferably be provided that the activation unit has an SR flip-flop and a switching element. The switching element, with the SR flip-flop not set, is switched in such a way as to connect the connection pad to a predetermined potential via a specific resistor. The connection pad is connected to a set input of the SR flip-flop in order to set the flip-flop by means of the activation signal in such a way that a switching element is switched in such a way as to isolate the connection pad from the predetermined potential. The use of an SR flip-flop in the activation unit makes it possible, e.g. by means of a setting of the SR flip-flop, to establish a permanent state in which the connection pad can be used as a test connection. In the state in which the connection pad is not used as a test connection, the connection pad is preferably connected to the predetermined potential, often a ground potential, via a defined resistor, so that it is possible to avoid floating of the connection pad and thus an undesired activation of the SR flip-flop.

In one embodiment, the switching element is preferably formed as a field-effect transistor.

Preferably, a reset input of the SR flip-flop is provided in order, in the case of a reset signal and/or a switch-on signal of the integrated circuit, to reset the SR flip-flop and to deactivate the measurement converter circuit. This makes it possible, after the conclusion of the checking of the one or more circuit-internal signals, to deactivate the measurement converter circuit, so that it does not consume a current during normal operation.

Preferably, the measurement converter circuit has a phase comparison unit, which compares the phase angle of a first and a second periodic signal with one another and outputs a pulse-width-modulated signal depending on the phase angle. In this way, it is possible to check the phase angle of two periodic signals that are related to one another, without the two signals firstly having to be tapped off by means of an external tester device in order to compare them with one another in the external tester device. The generation of the pulse-width-modulated signal in the integrated circuit thus makes it possible to carry out a more accurate determination of the phase angle, the measured value being configured in such a way that it can be read out by the external tester device simply and as accurately as possible.

The measurement converter circuit may also have a digital-to-analog converter unit in order to convert a digital signal into an analog voltage value, it being possible to output the analog voltage value as a measured value. The outputting of the measured value as an analog (essentially constant) voltage value has the advantage that the capacitances and inductances between the tester device and the measurement converter circuit essentially have no influence on the accuracy of the measurement.

A further aspect of the present invention provides a test system with a tester device and the integrated circuit according to the invention. The tester device is connected to the integrated circuit via a tester channel in order to transmit an activation signal to the integrated circuit and, after the transmission of the activation signal, to receive the measured value. Preferably, the tester device compares the received measured value with a desired measured value in order to check a function of the integrated circuit.

A further aspect of the present invention provides a method for checking a function in an integrated circuit. An activation signal is applied to a connection pad of the integrated circuit. The application of the activation signal is followed by a measurement of one or more circuit-internal signals, dependent on the function, in the integrated circuit. A resulting measured value is read out via the connection pad, the measured value depending on the checked function.

The method according to the invention has the advantage that a measured value which depends on the one or more circuit-internal signals is already generated in the integrated circuit, and that the measured value is read out via the connection pad. As a result, it is possible to measure very weak signals or operations in the case of very fast signals.

The activation signal is preferably a pulse signal which is applied to the connection pad in order to store an information item, the measurement being carried out depending on the storage of the information item.

A phase signal is preferably read out as a measured value, which phase signal is obtained by a comparison of two periodic signals.

BRIEF DESCRIPTION OF THE DRAWINGS

The invention is explained in more detail below with reference to the accompanying drawings, in which.

DETAILED DESCRIPTION OF THE PREFERRED EMBODIMENT

Figure 1:
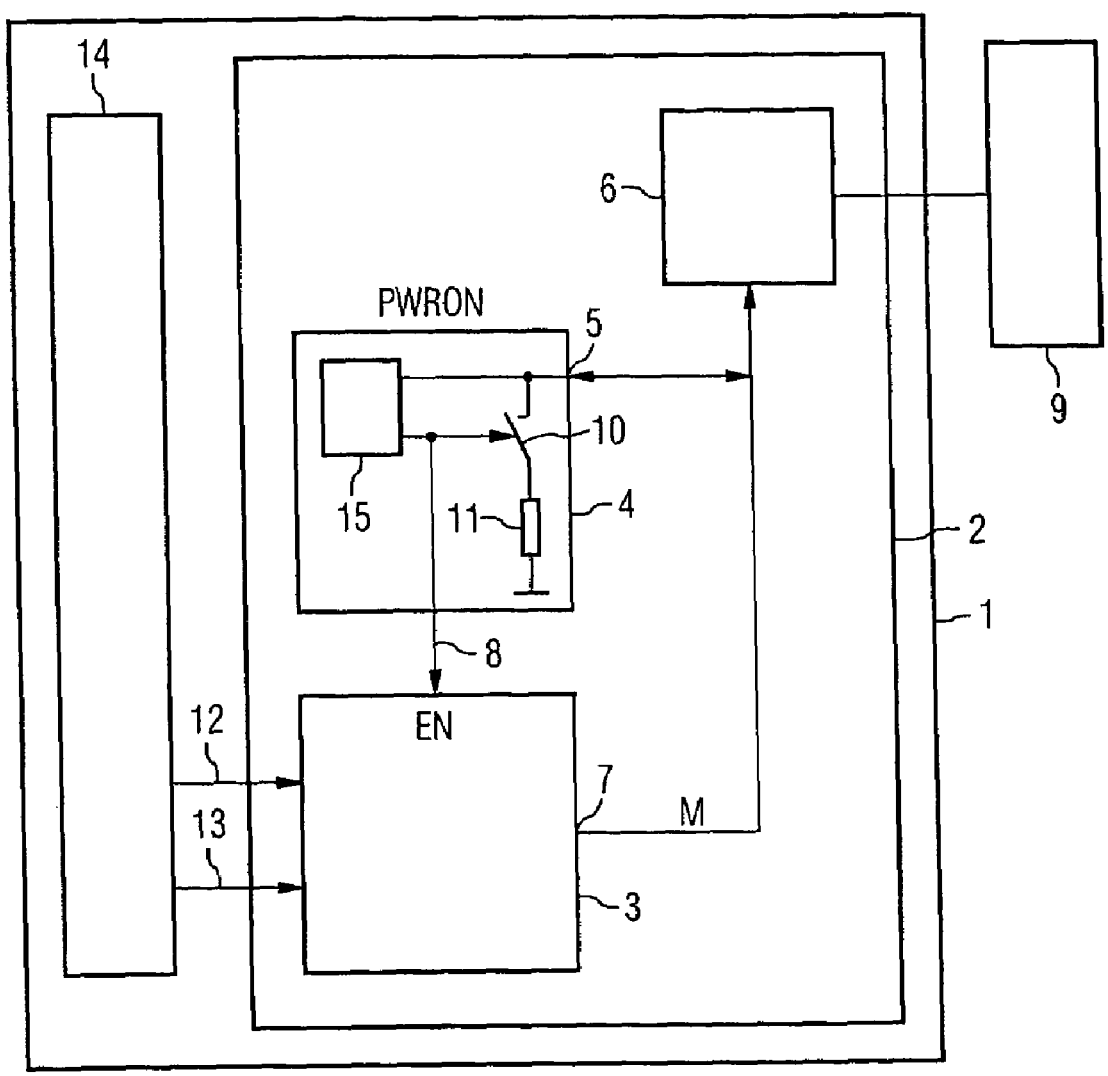
FIG. 1 shows a block diagram of an integrated circuit with a measurement converter circuit in accordance with an embodiment of the invention.

FIG. 1 illustrates a block diagram of an integrated circuit 1 according to the invention with a test circuit 2. The test circuit has a measurement converter circuit 3 and an activation unit 4. The activation unit 4 is connected to a connection pad 6 via a first connection 5. Equally, the measurement converter circuit 3 is connected to the connection pad 6 via a second connection 7. The activation unit 4 is connected to the measurement converter circuit 3 via a switch-on line 8 in order to transmit a switch-on signal EN to the measurement converter circuit 3.

The activation unit 4 is configured in such a way as to receive, via the connection pad 6, an activation signal which can be generated by an external tester device 9. The activation unit 4 has a memory unit 15, to which the activation signal is written in such a way that a switch 10 likewise provided in the activation unit 4 is opened. The switch 10 is connected in series with a resistor 11, so that the connection pad 6, with switch 10 closed, is connected to a fixed potential, preferably a ground potential, via the resistor 11. The switch 10 is closed after an initialization and/or after a switch-on of the integrated circuit 1 and is opened as a consequence of the activation signal.

The switch-on signal EN is also made available to the measurement converter circuit 3 via the switch-on line 8. The measurement converter circuit 3 is switched on by the switch-on signal EN and starts to convert measured internal signals.

For this purpose, the measurement converter circuit 3 is connected to a first internal signal via a first signal line 12 and to a second internal signal via a second signal line 13. In the exemplary embodiment shown, the measurement converter circuit 3 has the function of converting the phase angle of the first and the second internal signal S1, S2 into a measured value M, which can be measured by the external tester device 9 via the connection pad 6. The measured value M may be a voltage signal or a current signal which is converted into a proportional voltage via the resistor 11. The measured value may also be a pulsed signal which is output with a sufficient driver power to the connection pad 6, and the frequency of which is influenced only to an insignificant extent by line inductances and capacitances. The first and second internal signals S1, S2 are taken from a circuit 14, for example, in order to be able to check the function of the circuit. In this case, the first and second internal signals S1, S2 are tapped off in such a way that the circuit 14 or the function thereof is influenced as little as possible.

The measurement converter circuit 3 may be formed in diverse ways. A digital-to-analog converter circuit may be involved, which outputs a voltage value as a measured value. Internal states can thus be coded into an analog signal which can be interpreted by the external tester device 9.

The measurement converter circuit 3 may, by way of example, also determine the phase angle of the first and second internal signals S1, S2, a periodic signal whose duration of a state determines the phase angle of the first and second internal signals with respect to one another being output as a measured value. The determination of the phase angle of two internal signals is complicated since the internal signals would have to be read out into an external tester device 9, it being necessary to take account of signal delays on account of lead lengths. Furthermore, the internal signals would be influenced considerably by the load of the leads, so that a correct phase angle would not be able to be determined.

Figure 2:
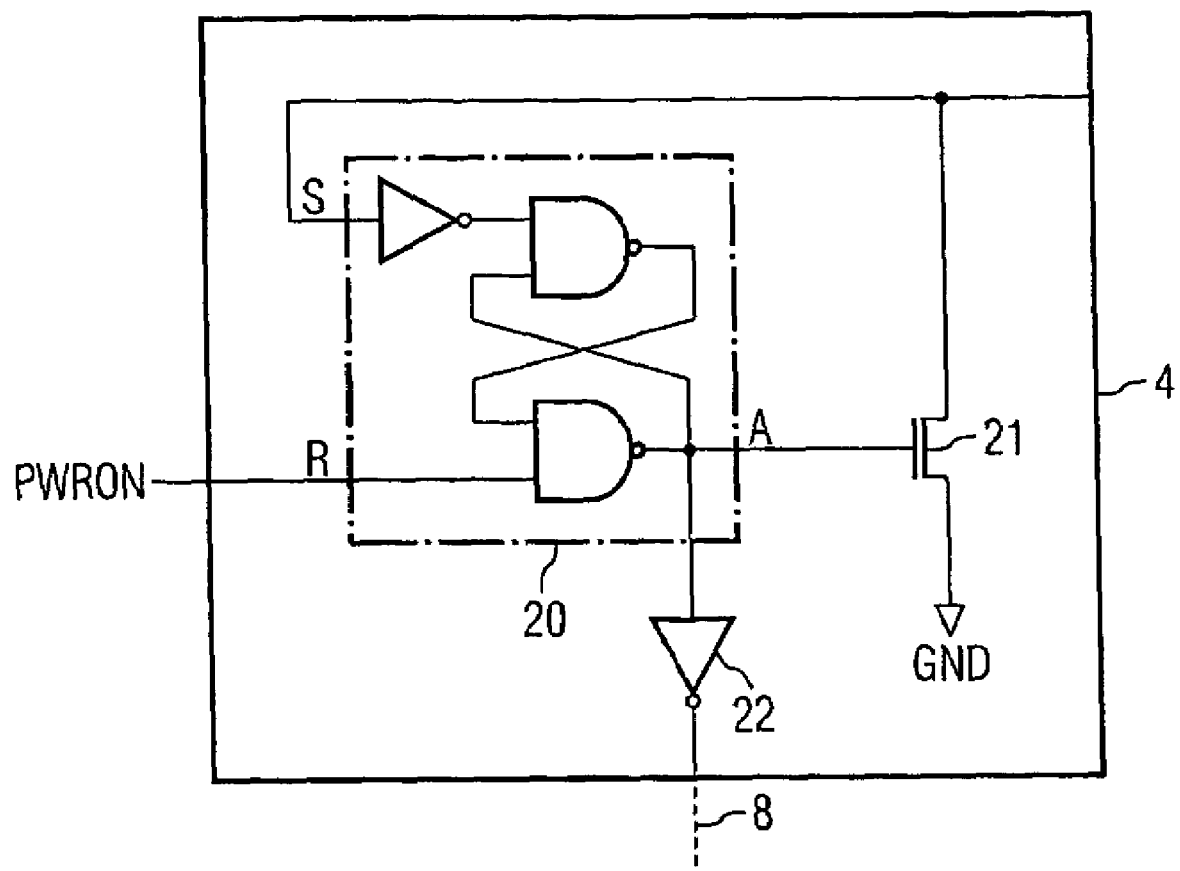
FIG. 2 shows a possible embodiment of an activation unit.

FIG. 2 illustrates an activation circuit in accordance with an embodiment of the invention. The activation unit 4 has an SR flip-flop 20 with two NAND gates, which is connected by a set input S to the connection pad 6. The output A of the SR flip-flop 20 is connected to a control input of a field-effect transistor 21. A first connection of the field-effect transistor 21 is likewise connected to the connection pad 6, a second connection of the field-effect transistor 21 is connected to a predetermined potential, preferably a ground potential GND. The output A of the SR flip-flop 20 is connected to the switch-on line 8 via a first inverter 22, the switch-on signal EN being present at an output of the first inverter 22. A reset input R of the SR flip-flop 20 is connected in such a way that a reset signal PWRON can be applied in order to reset the SR flip-flop 20.

After the switch-on or after an initialization of the integrated circuit, the SR flip-flop 20 is initially not set. The node A is then at a high potential. The field-effect transistor 21 is thus activated, i.e. it has a very low resistance. As a result, the connection pad 6 is pulled to the ground potential. This prevents the connection pad 6, which is otherwise not electrically connected, from being able to float, i.e. from being able to assume an undefined voltage as a result of charge flows in the integrated circuit. This prevents a high potential, which sets the SR flip-flop 20, from inadvertently being applied to the set input of the SR flip-flop 20.

If a voltage pulse which—taking account of the setup and hold time—sets the SR flip-flop 20 is applied to the connection pad 6, then a low potential is permanently present at the output A and turns off the field-effect transistor 21, i.e. the latter has a very high resistance. The connection pad 6 is thus isolated from the ground potential GND. By means of the set SR flip-flop 20, a high level of the switch-on signal EN is applied to the switch-on line 8, said signal activating the measurement converter circuit 3. The measurement converter circuit 3 remains activated and the field-effect transistor 21 remains turned off until a reset signal PWRON resets the SR flip-flop 20. The driver power for the application of the activation signal must be chosen in such a way that, with respect to the fixed potential applied via the resistor 11, the activation signal applies a high level at the set input S of the SR flip-flop 20.

After the SR flip-flop 20 has been set by the application of the high pulse of the activation signal at the connection pad 6, a measured value M can thus be tapped off from the measurement converter circuit 3 via the connection pad 6. The voltage levels of the measured value M do not influence the SR flip-flop 20 since the SR flip-flop 20 cannot be reset via the set input S.

Figure 3:
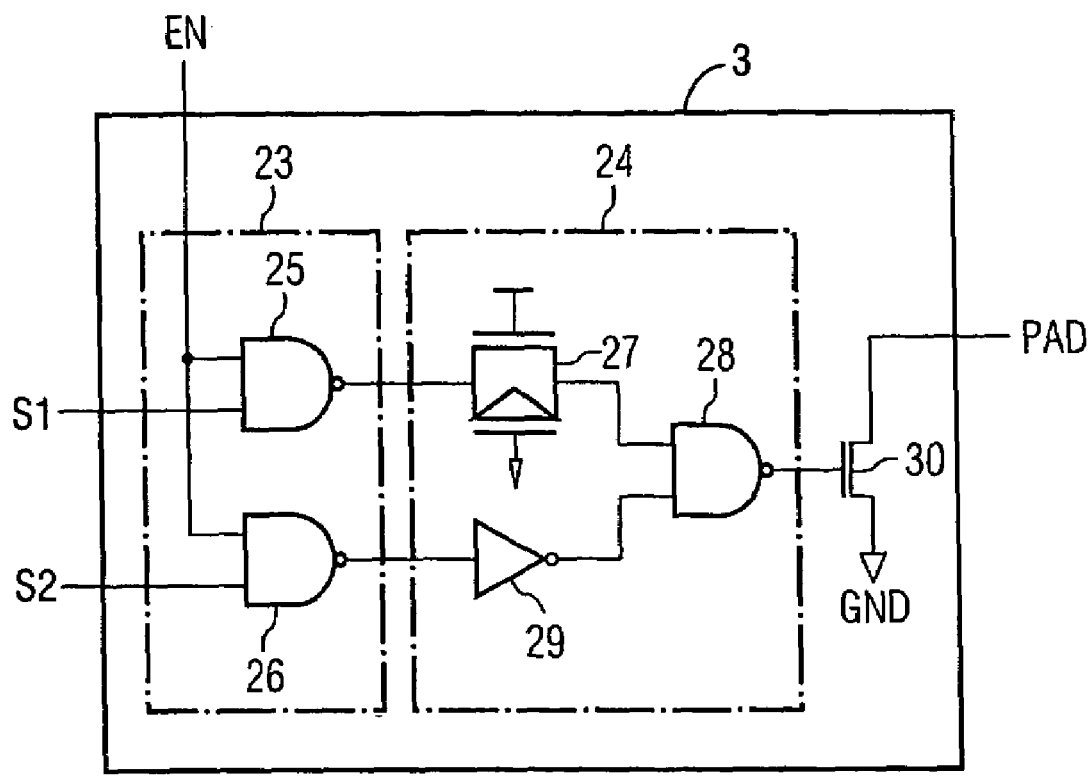
FIG. 3 shows a possible embodiment of a measurement converter circuit.

FIG. 3 illustrates a possible measurement converter circuit 3. The measurement converter circuit 3 has a switching device 23, which forwards the first and the second internal signal S1, S2, via respective NAND gates 25, 26, to a phase comparison unit 24. The switching device 23 applies the internal signals S1, S2 to the phase comparison unit 24 only when the switch-on signal from the switch-on line 8 indicates an activation of the measurement converter circuit 3.

The switching device 23 has a first NAND gate, to whose first input the switch-on signal EN is applied and to whose second input the first internal signal S1 is applied. The switching device 23 has a second NAND gate 26, to whose first input the switch-on signal EN is applied and to whose second input the second internal signal S2 is applied.

The phase comparison circuit 24 receives the signal at the output of the first NAND gate 25 and applies it via a transmission gate 27 to a first input of a third NAND gate 28. The signal at the output of the second NAND gate 26 is applied via a third inverter 29 to a second input of the third NAND gate 28. The output of the third NAND gate 28 is connected to a control input of a second field-effect transistor 30. The second field-effect transistor 30 is or is not activated in accordance with the output of the third NAND gate 28. The second field-effect transistor 30 is connected by a first connection to the connection pad 6 and by a second connection to a predetermined potential, preferably a ground potential.

Application of a voltage at the connection pad 6 by the external tester device 9 can bring about a current flow in the second field-effect transistor 30, which varies depending on the phase angle of the first and second internal signals. Thus, a current flows if the second field-effect transistor 30 is activated, and the current flow is interrupted if the second field-effect transistor is interrupted. The transmission gate 27 is provided in order to hold the delay of the signal at the output of the first NAND gate 25 up to the first input of the third NAND gate 28 essentially at the same value as the delay of the signal at the output of the second NAND gate 26 via the inverter 29 up to the second input of the third NAND gate 28.

Figure 4:
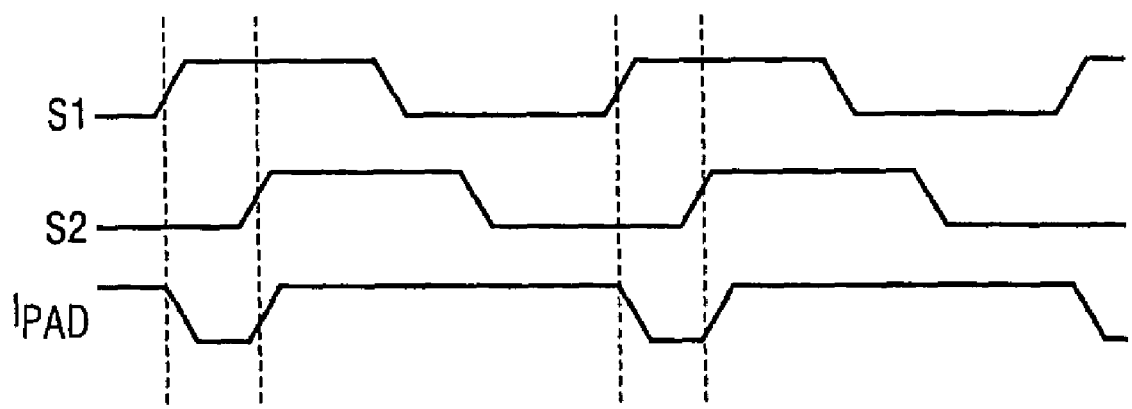
FIG. 4 shows a signal profile for input signals and the output signal in accordance with the measurement converter circuit according to FIG. 3.

FIG. 4 illustrates the signal profile of the first and second internal signals S1, S2, and also the output current profile in the connection pad 6. It can be seen that a current flows apart from the time period between the rising edge of the first internal signal S1 and the rising edge of the second internal signal S2. Thus, the length of the current flow interruption then indicates the phase angle of the first and second internal signals. Through the interconnect to the connection pad 6, the length of the lead between the tester device 9 and the connection pad 6 and also through the contact-making of the connection pad 6 with the aid of a measuring tip, there results a capacitance or inductance which smoothes the current profile through the connection pad 6. The result is a measurement voltage whose magnitude essentially depends on the phase angle of the first internal signal S1 and of the second internal signal S2.

The measurement converter circuit 3 is not restricted to a circuit for measuring the phase angle between two signals. In principle, any internal signal can be conditioned by means of the measurement converter circuit 3 in such a way that the internal signal can be checked in a simple manner by means of the external test device 9. The measured value may be transmitted to the external measuring device for example as a current, voltage or frequency. It is also possible to output a digital output signal in the form of a high or low potential to the external tester device 9.

What is claimed is:

1. A test circuit of an integrated circuit, the test circuit comprising:
    a connection pad;
    a measurement converter circuit connected to the connection pad and configured for converting one or more circuit-internal signals into a measured value; and
    an activation unit connected to the connection pad and configured for activating the measurement converter circuit in response to an activation signal received via the connection pad; the activation unit being configured in such a way as to permanently switch on the measurement converter circuit in response to the activation signal, it then being possible to tap off the measured value via the connection pad.

2. The test circuit of claim 1, wherein the activation unit comprises:
an SR flip-flop; and
a switching element which, with the SR flip-flop not set, is switched to connect the connection pad to a predetermined potential via a defined resistor and which, with the SR flip-flop set, is switched to isolate the connection pad from the predetermined potential.

3. The test circuit of claim 2, wherein the SR flip-flop is set in response to the activation signal.

4. The test circuit of claim 2, wherein the connection pad is connected to a set input of the SR flip-flop in order to set the SR flip-flop in response to the activation signal.

5. The test circuit of claim 2, wherein the switching element comprises a field-effect transistor.

6. The test circuit of claim 2, further comprising a reset input of the SR flip-flop configured to receive one or more signals to reset the SR flip-flop and to deactivate the measurement converter circuit.

7. The test circuit of claim 1, wherein the measurement converter circuit comprises a phase comparison unit, which compares the phase angle of a first and a second periodic signal with one another and outputs a pulse-width-modulated signal depending on the phase angle.

8. The test circuit of claim 1, wherein the measurement converter circuit comprises a digital-to-analog converter unit configured to convert a digital signal into an analog voltage value capable of being output as the measured value.

9. A test circuit of an integrated circuit, the test circuit comprising:
a measurement converter circuit configured for converting one or more circuit-internal signals into a measured value and outputting the measured value for receipt by an external testing device;
an activation unit configured for activating the measurement converter circuit in response to an activation signal;
a connection pad to which the measurement converter circuit and activation unit are connected; and
a switching element which is switchable to connect the connection pad to a predetermined potential and switchable to isolate the connection pad from the predetermined potential.

10. A test circuit of an inteprated circuit, the test circuit comprising:
a measurement converter circuit configured for converting one or more circuit-internal signals into a measured value and outputting the measured value for receipt by an external testing device; wherein the measurement converter circuit comprises a phase comparison unit, which compares the phase angle of a first and a second periodic signal with one another and outputs a pulse-width-modulated signal depending on the phase; and
an activation unit configured for activating the measurement converter circuit in response to an activation signal.

11. An apparatus, comprising:
a test circuit of an integrated circuit, the test circuit comprising:
a measurement converter circuit configured for converting one or more circuit-internal signals into a measured value; and
an activation unit configured for activating the measurement converter circuit in response to an activation signal; and
a test system comprising a tester device connected to the integrated circuit via a tester channel in order to transmit the activation signal to the activation unit and, after the transmission of the activation signal, to receive the measured value.

12. The apparatus of claim 11, wherein the tester device is configured to compare the received measured value with a desired measured value in order to check a function of the integrated circuit.

13. The apparatus of claim 11, wherein the measurement converter circuit comprises a phase comparison unit, which compares the phase angle of a first and a second periodic signal with one another and outputs a pulse-width-modulated signal depending on the phase angle.

14. The apparatus of claim 11, wherein the test circuit comprises a connection pad to which the measurement converter circuit, the activation unit and the tester device are connected, whereby the activation unit receives the activation signal via the connection pad and the measurement converter circuit outputs the measured value to the connection pad.

15. The apparatus of claim 14, wherein the test circuit further comprises a switching element which is switchable to connect the connection pad to a predetermined potential and switchable to isolate the connection pad from the predetermined potential.

16. The test circuit of claim 9, wherein the measurement converter circuit comprises a phase comparison unit, which compares the phase angle of a first and a second periodic signal with one another and outputs a pulse-width-modulated signal depending on the phase angle.

* * * * *

UNITED STATES PATENT AND TRADEMARK OFFICE
CERTIFICATE OF CORRECTION

PATENT NO.         : 7,135,723                                    Page 1 of 1
APPLICATION NO. : 10/810489
DATED               : November 14, 2006
INVENTOR(S)       : Szczpinski et al.

It is certified that error appears in the above-identified patent and that said Letters Patent is hereby corrected as shown below:

In Claim 10, at Column 7, Line 50, please delete "inteprated" and insert --integrated--.

In claim 10, at column 8, Line 6, after "phase", please insert --angle--.

Signed and Sealed this

Twentieth Day of November, 2007

JON W. DUDAS
*Director of the United States Patent and Trademark Office*